United States Patent
Scoggins et al.

(10) Patent No.: US 11,117,806 B2
(45) Date of Patent: Sep. 14, 2021

(54) SILICON CARBIDE/GRAPHITE COMPOSITE AND ARTICLES AND ASSEMBLIES COMPRISING SAME

(71) Applicant: Entegris, Inc., Billerica, MA (US)

(72) Inventors: Troy Scoggins, Decatur, TX (US); Rex Gerald Sheppard, Decatur, TX (US); Abuagela H. Rashed, Denton, TX (US); Jonathan Loyd Burr, Denton, TX (US)

(73) Assignee: ENTEGRIS, INC., Billerica, MA (US)

( * ) Notice: Subject to any disclaimer, the term of this patent is extended or adjusted under 35 U.S.C. 154(b) by 465 days.

(21) Appl. No.: 15/753,109

(22) PCT Filed: Aug. 18, 2016

(86) PCT No.: PCT/US2016/047533
§ 371 (c)(1),
(2) Date: Feb. 15, 2018

(87) PCT Pub. No.: WO2017/031304
PCT Pub. Date: Feb. 23, 2017

(65) Prior Publication Data
US 2018/0240878 A1    Aug. 23, 2018

Related U.S. Application Data

(60) Provisional application No. 62/207,375, filed on Aug. 20, 2015, provisional application No. 62/265,376, filed on Dec. 9, 2015.

(51) Int. Cl.
*C01B 32/956* (2017.01)
*H01L 21/02* (2006.01)
(Continued)

(52) U.S. Cl.
CPC .......... *C01B 32/956* (2017.08); *C01B 32/21* (2017.08); *C01B 32/97* (2017.08); *C04B 35/522* (2013.01);
(Continued)

(58) Field of Classification Search
CPC ............ H01L 29/1608; H01L 29/1606; H01L 21/02425; H01L 21/02529;
(Continued)

(56) References Cited

U.S. PATENT DOCUMENTS

| 4,513,030 A | 4/1985 | Milewski |
| 5,017,527 A | 5/1991 | June-Gunn et al. |

(Continued)

FOREIGN PATENT DOCUMENTS

| CN | 1329583 A | 1/2002 |
| CN | 102285655 A | 12/2011 |

(Continued)

OTHER PUBLICATIONS

Silicon carbide, accessed online at https://en.wikipedia.org/wiki/Silicon_carbide on Aug. 31, 2020 (Year: 2020).*
(Continued)

*Primary Examiner* — Daniel C. McCracken
(74) *Attorney, Agent, or Firm* — Entegris, Inc.

(57) ABSTRACT

A silicon carbide-graphite composite is described, including (i) interior bulk graphite material and (ii) exterior silicon carbide matrix material, wherein the interior bulk graphite material and exterior silicon carbide matrix material interpenetrate one another at an interfacial region therebetween, and wherein graphite is present in inclusions in the exterior silicon carbide matrix material. Such material may be formed by contacting a precursor graphite article with silicon monoxide (SiO) gas under chemical reaction conditions that are effective to convert an exterior portion of the
(Continued)

precursor graphite article to a silicon carbide matrix material in which graphite is present in inclusions therein, and wherein the silicon carbide matrix material and interior bulk graphite material interpenetrate one another at an interfacial region therebetween. Such silicon carbide-graphite composite is usefully employed in applications such as implant hard masks in manufacturing solar cells or other optical, optoelectronic, photonic, semiconductor and microelectronic products, as well as in ion implantation system materials, components, and assemblies, such as beam line assemblies, beam steering lenses, ionization chamber liners, beam stops, and ion source chambers.

15 Claims, 5 Drawing Sheets (51) Int. Cl.
| | |
|---|---|
| H01L 21/324 | (2006.01) |
| C04B 41/87 | (2006.01) |
| C04B 35/52 | (2006.01) |
| C04B 41/00 | (2006.01) |
| C04B 41/50 | (2006.01) |
| C01B 32/97 | (2017.01) |
| C01B 32/21 | (2017.01) |
| H01L 29/16 | (2006.01) |
| C04B 111/00 | (2006.01) |

(52) U.S. Cl.
CPC ........ *C04B 41/009* (2013.01); *C04B 41/5059* (2013.01); *C04B 41/87* (2013.01); *H01L 21/02425* (2013.01); *H01L 21/02529* (2013.01); *H01L 21/02612* (2013.01); *H01L 21/324* (2013.01); *H01L 29/1606* (2013.01); *H01L 29/1608* (2013.01); *C04B 2111/00405* (2013.01); *C04B 2235/3826* (2013.01); *C04B 2235/658* (2013.01); *C04B 2235/6581* (2013.01); *C04B 2235/72* (2013.01); *C04B 2235/722* (2013.01); *C04B 2235/726* (2013.01); *C04B 2235/727* (2013.01); *C04B 2235/728* (2013.01); *C04B 2235/75* (2013.01); *C04B 2235/77* (2013.01); *C04B 2235/786* (2013.01); *C04B 2235/9607* (2013.01)

(58) Field of Classification Search
CPC ............. H01L 21/02612; H01L 21/324; H01L 21/02115; H01L 21/02378; C04B 41/87; C04B 35/522; C04B 41/009; C04B 41/5059; C04B 2235/9607; C04B 2235/728; C04B 2235/72; C04B 2111/00405; C04B 2235/727; C04B 2235/3826; C04B 2235/77; C04B 2235/75; C04B 2235/658; C04B 2235/6581; C04B 2235/786; C04B 2235/722; C04B 2235/726; C01B 32/20; C01B 32/956; C01B 32/97; C01B 32/21

See application file for complete search history.

(56) References Cited

U.S. PATENT DOCUMENTS

| | | | |
|---|---|---|---|
| 5,380,372 A | | 1/1995 | Campe et al. |
| 5,486,496 A | | 1/1996 | Talbert |
| 5,525,372 A | | 6/1996 | Sayles |
| 5,656,563 A | * | 8/1997 | Chen ..................... C04B 35/532 |
| | | | 428/446 |
| 6,426,133 B1 | * | 7/2002 | Kondo ................ C04B 41/5059 |
| | | | 428/213 |
| 2002/0028360 A1 | * | 3/2002 | Shaffer ................. C04B 35/632 |
| | | | 428/699 |
| 2010/0179049 A1 | | 7/2010 | Fukuoka et al. |
| 2010/0323508 A1 | | 12/2010 | Adibi et al. |
| 2011/0111171 A1 | | 5/2011 | Oyanagi et al. |
| 2015/0037017 A1 | | 2/2015 | Lau et al. |

FOREIGN PATENT DOCUMENTS

| | | |
|---|---|---|
| CN | 102804329 B | 7/2015 |
| JP | S5696788 A | 8/1981 |

OTHER PUBLICATIONS

Carbon, accessed online at https://en.wikipedia.org/wiki/Carbon on Aug. 31, 2020 (Year: 2020).*

Tran, et al., Influence of the Grain Size of Precursor Graphite on the Synthesis of Graphite Oxide, New Physics: Sae Mulli 2012; 63(2): 0-3 (Year: 2012).*

Fujii et al., "Functionally gradient material of silicon carbide and carbon as advanced oxidation-resistant graphite", Journal of Nuclear Materials, vol. 187, No. 3, 1992, pp. 204-208.

Shimoo et al., "Mechanism of formation of SiC by reaction of SiO with graphite and CO", Journal of Japan Inst. Metals, vol. 52, No. 3, 1988, pp. 279-287.

* cited by examiner

SILICON CARBIDE/GRAPHITE COMPOSITE AND ARTICLES AND ASSEMBLIES COMPRISING SAME

CROSS-REFERENCE TO RELATED APPLICATIONS

This application is filed under the provisions of 25 U.S.C. 0371 claiming priority of International Patent Application No. PCT/US2016/047533 filed on Aug. 18, 2016 entitled, "SILICON CARBIDE/GRAPHITE COMPOSITE AND ARTICLES AND ASSEMBLIES COMPRISING SAM" that claims the benefit under 35 USC 119 of U.S. Provisional Patent Application 62/207,375 filed Aug. 20, 2015 for SILICON CARBIDE/GRAPHITE COMPOSITE AND ARTICLES AND ASSEMBLIES COMPRISING SAME, and of U.S. Provisional Patent Application 62/265,376 filed Dec. 9, 2015 for SILICON CARBIDE/GRAPHITE COMPOSITE AND ARTICLES AND ASSEMBLIES COMPRISING SAME. The disclosures of such U.S. provisional patent applications are hereby incorporated herein by reference, in their entireties, for all purposes.

FIELD

The present disclosure relates to silicon carbide/graphite composites, and to materials, articles and assemblies comprising same.

DESCRIPTION OF THE RELATED ART

Graphite components and assemblies are utilized in the manufacture of LEDs, e.g., in susceptor articles that are utilized in chambers for growing LEDs, and in ion implantation, such as in implant hard masks for manufacturing solar cells, and in ion implanters in beam steering lenses, chamber liners, beam stops, and source chambers.

In these applications, although graphite has associated properties that render it advantageous, it also has deficiencies as a material of construction, as for example inadequate chemical resistance, tribological properties, and susceptibility to generation of particles. By way of illustration, graphite susceptors used in growing LEDs are attacked and eroded by many processing chemicals utilized in growing LEDs, particularly high brightness LEDs. In ion implantation, beam lines formed of graphite or glassy carbon-impregnated graphite are susceptible to erosion and particle generation in consequence of beam strike, sputtering, and ablation mechanisms.

In various of the foregoing applications, coatings of silicon carbide on such graphite components and assemblies have been contemplated, in consequence of the favorable properties of silicon carbide, including hardness, chemical resistance, and favorable tribological properties. The corresponding SiC-coated graphite structures have not been successfully implemented, however, since they require thermal stability in variable temperature regimes, and since SiC and graphite are significantly different in thermal shock resistance. As a result, SiC-coated graphite structures in ion implanter applications are prone to failure as a result of high thermal shock associated with beam strikes that cause the SiC to fracture, and in these and other applications the coefficient of thermal expansion (CTE) mismatch between the SiC and graphite can effect delamination of the SiC coating from the graphite base material when even small temperature variations are experienced.

In consequence, the art continues to seek improvements in graphite articles and assemblies used in such applications.

SUMMARY

The present disclosure relates to silicon carbide/graphite composites, and to materials, articles and assemblies comprising same.

The disclosure relates in one aspect to a silicon carbide-graphite composite comprising (i) interior bulk graphite material and (ii) exterior silicon carbide matrix material, wherein the interior bulk graphite material and exterior silicon carbide matrix material inter-penetrate one another at an interfacial region therebetween, and wherein graphite is present in inclusions in the exterior silicon carbide matrix material.

In another aspect, the disclosure relates to a silicon carbide-graphite composite comprising (i) interior bulk graphite material and (ii) exterior silicon carbide matrix material, wherein the interior bulk graphite material and exterior silicon carbide matrix material inter-penetrate one another at an interfacial region therebetween, and wherein graphite is present in inclusions in the exterior silicon carbide matrix material; said silicon carbide-graphite composite being characterized by any two or more characteristics selected from the group consisting of:
(i) the ratio of the thickness of the interior bulk graphite material to the thickness of the exterior silicon carbide matrix material is in a range of from 5 to 10,000;
(ii) the exterior silicon carbide matrix material has a thickness in a range of from 150 to 1000 μm;
(iii) the grain size of graphite in the silicon carbide-graphite composite is in a range of from 5 to 20 μm;
(iv) the density of the silicon carbide-graphite composite is in a range of from 1.6 to 2.4 g per cc of the composite;
(v) the coefficient of thermal expansion (CTE) of the composite is in a range of from 4 to $6.5 \times 10^{-6}/°$ C.;
(vi) a characterization parameter, $C_p$, of the composite is in a range of from 0.5 to 3.2%/cm$^{-1}$, wherein $C_p$ is defined by the relationship $C_p = W_g/[S/V]$, wherein: $W_g$, is the percent (%) weight gain of the graphite material that is subjected to contact with silicon monoxide to effect reaction producing the composite; and S/V is the surface-to-volume ratio of the product composite, wherein S is the surface area of the composite, in square centimeters, and V is the volume of the composite, in cubic centimeters;
(vii) the composite is devoid of any silicon carbide capping layer thereon;
(viii) the composite is a vitreous carbon-free composite;
(ix) formation of the composite has comprised conversion bonding of graphite dust grains in porosity of the interior bulk graphite material;
(x) the composite contains no free silicon; and
(xi) the composite is doped with nitrogen.

A further aspect of the disclosure relates to a material, article or assembly comprising such silicon carbide-graphite composite, e.g., an implant hard mask for use in manufacturing solar cells, or an ion implantation apparatus material, assembly or component, such as a beam line assembly, beam steering lenses, ionization chamber liners, beam stops, and source chambers.

Another aspect of the disclosure relates to a method of making such silicon carbide-graphite composite, comprising contacting a graphite article with silicon monoxide (SiO) gas under chemical reaction conditions that are effective to convert an exterior portion of the graphite article to a silicon carbide matrix material in which graphite is present in inclusions therein, and wherein the silicon carbide matrix material and interior bulk graphite material interpenetrate one another at an interfacial region therebetween.

Yet another aspect of the disclosure relates to a method of making a silicon carbide-graphite composite, comprising contacting a graphite article with silicon monoxide (SiO) gas under chemical reaction conditions that are effective to convert an exterior portion of the graphite article to a silicon carbide matrix material in which graphite is present in inclusions therein, and wherein the silicon carbide matrix material and interior bulk graphite material interpenetrate one another at an interfacial region therebetween, wherein the chemical reaction conditions are effective to yield the silicon carbide-graphite composite, wherein the composite is characterized by any two or more characteristics selected from the group consisting of:

(i) the ratio of the thickness of the interior bulk graphite material to the thickness of the exterior silicon carbide matrix material is in a range of from 5 to 10,000;
(ii) the exterior silicon carbide matrix material has a thickness in a range of from 150 to 1000 μm;
(iii) the grain size of graphite in the silicon carbide-graphite composite is in a range of from 5 to 20 μm;
(iv) the density of the silicon carbide-graphite composite is in a range of from 1.6 to 2.4 g per cc of the composite;
(v) the coefficient of thermal expansion (CTE) of the composite is in a range of from 4 to $6.5 \times 10^{-6}$/° C.;
(vi) a characterization parameter, $C_p$, of the composite is in a range of from 0.5 to 3.2%/cm$^{-1}$, wherein $C_p$ is defined by the relationship $C_p = W_g/[S/V]$, wherein: $W_g$, is the percent (%) weight gain of the graphite material that is subjected to contact with silicon monoxide to effect reaction producing the composite; and S/V is the surface-to-volume ratio of the product composite, wherein S is the surface area of the composite, in square centimeters, and V is the volume of the composite, in cubic centimeters;
(vii) the composite is devoid of any silicon carbide capping layer thereon;
(viii) the composite is a vitreous carbon-free composite;
(ix) formation of the composite has comprised conversion bonding of graphite dust grains in porosity of the interior bulk graphite material;
(x) the composite contains no free silicon; and
(xi) the composite is doped with nitrogen.

Other aspects, features and embodiments of the disclosure will be more fully apparent from the ensuing description and appended claims.

DETAILED DESCRIPTION

The present disclosure relates to silicon carbide/graphite composites, and to articles and assemblies comprising same, such as may be utilized for the manufacture of LEDs, solar cells and photovoltaic panels, flat-panel displays, and semiconductor and microelectronic products.

The disclosure relates in one aspect to a silicon carbide-graphite composite comprising (i) interior bulk graphite material and (ii) exterior silicon carbide matrix material, wherein the interior bulk graphite material and exterior silicon carbide matrix material inter-penetrate one another at an interfacial region therebetween, and wherein graphite is present in inclusions in the exterior silicon carbide matrix material.

The silicon carbide-graphite composite of the present disclosure can be provided in various shapes, forms, and conformations, having a silicon carbide surface layer intermixed with graphite, and an underlying graphite core. Such composite material resists oxidation and resists delamination when thermally shocked, in contrast to silicon carbide, which will crack or shatter when suddenly cooled from a high temperature.

The composite may be formed by chemical vapor conversion to partially convert outer layers of graphite to silicon carbide, as hereinafter more fully described. This partial conversion of the graphite avoids the formation of a distinct silicon carbide layer that could delaminate under stress. Such "shell conversion" achieves the most favorable attributes of silicon carbide and graphite in a single component article having advantages over either material separately, and advantages over previously known silicon carbide coated products.

This shell conversion also achieves a low cost of ownership in comparison to graphite and other ceramic materials that may be used in applications such as beamline structures of ion implantation equipment, as a result of the higher performance and reduced cost characteristics of the silicon carbide-graphite composite in relation to such graphite and ceramic materials.

In addition to use in ion implant tools, the silicon carbide-graphite composite has utility in a variety of applications, e.g., aerospace applications, where high resistance to oxidation at very high temperatures for short periods of time (on the order of minutes) is required.

More specifically, the silicon carbide-graphite composite of the present disclosure has a number of favorable attributes and performance properties that enable its use in a wide variety of specific applications. Such composite has increased thermal shock resistance compared to solid silicate carbide. For example, at thermal shock levels (change in temperature, ΔT, in ° C.) in a range of from 200° C. ΔT to 400° C. ΔT, the flexural strength of silicon carbide-graphite composites of the present disclosure has been demonstrated to be in a range of 75.8 to 124.1 kPa (11,000-18,000 psi). The silicon carbide-graphite composites of the present disclosure have initial plasma erosion resistance and physical abrasion resistance that are similar to those of silicon carbide. The silicon carbide-graphite composite is able to hold a tight tolerance with an as-converted artifact. It has higher electrical conductivity than silicon carbide-coated graphite formed by chemical vapor deposition. The silicon carbide shell of the silicon carbide-graphite composite is thicker than conventional chemical vapor deposition coatings over graphite. The composite achieves a low-cost due to elimination of post-conversion machining. The coefficient of thermal expansion (CTE) of the silicon carbide shell matches silicon and nitride depositions. The silicon carbide shell is much harder than the graphite underlayer, thereby achieving substantially increased component life.

Illustrative material properties of a silicon carbide-graphite composite of the present disclosure are set out in Table 1 below.

TABLE 1

| Property | |
|---|---|
| Bulk density* | 2.18 g/cm³ (0.079 lb/in³) |
| Total impurity | <10 ppm by weight |
| Flexural strength** | 69 MPa (10,000 psi) |
| Thermal conductivity | 88 W/m-K (51 BTU-ft/hr/ft$^{2\circ}$ F.) |
| Electrical resistivity | 3050 μΩ-cm (1200 μΩ-in) |
| Instantaneous CTE from 250-750° C. | 4.5 10⁻⁶/K (2.5 10⁻⁶/° F.) |

*Based on surface area/volume ratio of 12.5.
**4 pt based on 0.25" × 0.5" × 4" MOR bar The silicon carbide-graphite composite of the disclosure may be utilized in a wide variety corresponding materials, articles and/or assemblies comprising such composite. For example, the silicon carbide-graphite composite can be utilized in an implant hard mask for use in manufacturing solar cells or other optical, optoelectronic, photonic, semiconductor and microelectronic products. The silicon carbide-graphite composite can also be utilized in ion implantation systems, as an ion implantation apparatus material, assembly or component. Examples of such usage include beam line assemblies, beam steering lenses, ionization chamber liners, beam stops, and ion source chambers.

In one specific application, the silicon carbide-graphite composite of the present disclosure is utilized in a susceptor of a type utilized for growing light emitting diodes (LEDs). The susceptor may have elongate through holes, e.g., with an aspect ratio of length:width of greater than 3:1, extending through the thickness of the susceptor article. The susceptor article may be formed of a bulk graphite material that is processed in accordance with the disclosure, to form a silicon carbide matrix material on outer surface regions of the susceptor article as well as on internal surface regions in the through holes of the susceptor article. The resulting susceptor product article thus is protected by an exterior overlying silicon carbide matrix material integrally associated with the interior bulk graphite material. As a result, the susceptor article will resist erosion from process chemicals utilized in the LED growth process, both on the main surfaces as well as surface in the through holes of the susceptor article.

Thus, the disclosure contemplates a silicon carbide-graphite composite comprising (i) interior bulk graphite material and (ii) exterior silicon carbide matrix material, wherein the interior bulk graphite material and exterior silicon carbide matrix material inter-penetrate one another at an interfacial region therebetween, and wherein graphite is present in inclusions in the exterior silicon carbide matrix material.

Such silicon carbide-graphite composite may be configured, wherein each of the (i) interior bulk graphite material and (ii) exterior silicon carbide matrix material has a respective thickness, wherein the thickness of the interior bulk graphite material is greater than the thickness of the exterior silicon carbide matrix material. For example, in various embodiments, the ratio of the thickness of the interior bulk graphite material to the thickness of the exterior silicon carbide matrix material may be in a range of from 5 to 10,000, or from 10 to 1000, or in other suitable range appropriate to the end use application of the composite.

The above-described silicon carbide-graphite composite may be constituted with the exterior silicon carbide matrix material having a thickness in a range of from 150 to 1000 μm. In various embodiments, the grain size of the graphite in the silicon carbide-graphite composite may be in a range of from 5 to 20 μm, or in a range of from 10 to 15 μm, or in other suitable range appropriate to the end use application of the composite.

In various embodiments, the density of the silicon carbide-graphite composite may be in a range of from 1.6 to 2.4 g per cc of the composite, or in a range of from 2.0 to 2.25 g per cc of the composite, or in other suitable range.

The silicon carbide-graphite composite of the disclosure in various embodiments may have a coefficient of thermal expansion (CTE) of the composite in a range of from 4 to 6.5×10⁻⁶/° C.

In various embodiments, the silicon carbide-graphite composite of the disclosure may be formed by contact of graphite with silicon monoxide to effect reaction producing the composite, and the composite may have a characterization parameter, $C_p$, in a range of from 0.5 to 3.2%/cm⁻¹, wherein $C_p$ is defined by the relationship $C_p = W_g/[S/V]$, wherein $W_g$, is the percent (%) weight gain of the graphite material that is subjected to contact with silicon monoxide to effect reaction producing the composite; and S/V is the surface-to-volume ratio of the product composite, wherein S is the surface area of the composite, in square centimeters, and V is the volume of the composite, in cubic centimeters.

In various embodiments, the composite characterization parameter $C_p$ may for example be in a range of from 0.5 to 2%/cm$^{-1}$, and in other embodiments, the composite characterization parameter $C_p$ may be in a range of from 0.55 to 1.8%/cm$^{-1}$.

The silicon carbide-graphite composite of the disclosure in other implementations may be devoid of any silicon carbide capping layer thereon. The silicon carbide-graphite composite in still other implementations may be a vitreous carbon-free composite. In yet other implementations, the silicon carbide-graphite composite of the disclosure may be formed, as comprising conversion bonding of graphite dust grains in porosity of the interior bulk graphite material.

Silicon carbide composites in accordance with the present disclosure may be formed so as to contain no free silicon. Composites of the disclosure may be doped with nitrogen, e.g., at a nitrogen content of from 0.1 to 1.2% by weight, based on total weight of the composite, or from 0.2 to 0.9% by weight, based on total weight of the composite, or from 0.3 to 0.7% by weight, based on total weight of the composite, or at other doping concentration of nitrogen in the composite material.

A silicon carbide-graphite composite of the disclosure thus may comprise (i) interior bulk graphite material and (ii) exterior silicon carbide matrix material, wherein the interior bulk graphite material and exterior silicon carbide matrix material inter-penetrate one another at an interfacial region therebetween, and wherein graphite is present in inclusions in the exterior silicon carbide matrix material; with the silicon carbide-graphite composite being characterized by any two or more characteristics selected from the group consisting of:

(i) the ratio of the thickness of the interior bulk graphite material to the thickness of the exterior silicon carbide matrix material is in a range of from 5 to 10,000;
(ii) the exterior silicon carbide matrix material has a thickness in a range of from 150 to 1000 μm;
(iii) the grain size of graphite in the silicon carbide-graphite composite is in a range of from 5 to 20 μm;
(iv) the density of the silicon carbide-graphite composite is in a range of from 1.6 to 2.4 g per cc of the composite;
(v) the coefficient of thermal expansion (CTE) of the composite is in a range of from 4 to 6.5×10$^{-6}$/° C.;
(vi) a characterization parameter, $C_p$, of the composite being in a range of from 0.5 to 3.2%/cm$^{-1}$, wherein $C_p$ is defined by the relationship $C_p=W_g[S/V]$, wherein $W_g$, is the percent (%) weight gain of the graphite material that is subjected to contact with silicon monoxide to effect reaction producing the composite; and S/V is the surface-to-volume ratio of the product composite, wherein S is the surface area of the composite, in square centimeters, and V is the volume of the composite, in cubic centimeters;
(vii) the composite is devoid of any silicon carbide capping layer thereon;
(viii) the composite is a vitreous carbon-free composite;
(ix) formation of the composite has comprised conversion bonding of graphite dust grains in porosity of the interior bulk graphite material;
(x) the composite contains no free silicon; and
(xi) the composite is doped with nitrogen.

A further aspect of the disclosure relates to materials, articles, or assemblies comprising the above-described silicon carbide-graphite composites of the disclosure. Examples include an implant hard mask for use in an ion implantation apparatus in a manufacturing facility for manufacture of an optical, optoelectronic, photonic, semiconductor, or microelectronic product. For example, the implantation apparatus in the manufacturing facility may be configured for the manufacture of solar cells. The material, article, or assembly in various embodiments may comprise an ion implantation apparatus material, assembly, or component, e.g., wherein the ion implantation apparatus material, assembly, or component is comprised in at least one of beam line assemblies, beam steering lenses, ionization chamber liners, beam stops, and ion source chambers of the ion implantation apparatus. As another example, the material, article, or assembly may comprise a susceptor for an LED growth apparatus, wherein the silicon carbide matrix material of the composite is at least a portion of surface of the susceptor, e.g., in which the susceptor contains through hole(s) therein, and the silicon carbide matrix material of the composite is at internal surface of the hole(s).

Another aspect of the disclosure relates to a method of making such silicon carbide-graphite composite, comprising contacting a graphite article with silicon monoxide (SiO) gas under chemical reaction conditions that are effective to convert an exterior portion of the graphite article to a silicon carbide matrix material in which graphite is present in inclusions therein, and wherein the silicon carbide matrix material and interior bulk graphite material interpenetrate one another at an interfacial region therebetween.

The reaction conditions in the broad practice of the disclosure may be varied to provide a silicon carbide-graphite composite of the specific desired character. In various embodiments, the reaction of the graphite article with silicon monoxide (SiO) gas may be conducted at temperature in a range of from 1400 to 2000° C. In other embodiments, the chemical reaction may be conducted at temperature in a range of from 1600 to 1900° C., and in still other embodiments, the reaction may be conducted at temperature in a range of from 1750 to 1850° C., e.g., at 1800° C. The silicon monoxide (SiO) gas in a specific embodiment may be contacted with the graphite article in a gas mixture in which the SiO concentration is in a range of from 5 to 50% by volume, based on the total volume of the gas mixture, with the balance of the gas mixture being CO and inert gas, e.g., nitrogen, helium, argon, etc. Other gas mixtures containing the silicon monoxide may be employed in the contacting, to carry out the reaction and produce the silicon carbide-graphite composite.

Thus, the method of the present disclosure converts an exterior surface portion of the graphite starting material or article to the SiC matrix material by chemical reaction with gas phase silicon monoxide (SiO). The graphite starting material or article thus may be provided in a predetermined or otherwise desired shape or form, e.g., by machining such starting material or article, or otherwise by mechanically, chemically, and/or photonically (e.g., by lasing action) removing material from the raw bulk material or article.

Thereafter, the chemical reaction forming the SiC matrix material results in an overall reaction product having essentially the same dimensional character as the graphite starting material or article. Further, the (piece) density of the reaction product material or article will be similar to that of the graphite starting material or article, with the exception of a small difference in density resulting from the small differences in density between SiC and graphite.

The silicon carbide-graphite composite of the present disclosure achieves a substantial advance in the art. For example, in reference to beam line usages of graphite per se, graphite can be used in high temperature applications, but the problem with the use of pure bulk graphite is that the ion beam erodes graphite over time and creates particulates, which is a substantial problem in the manufacture of semiconductor and other products, and which may render such products efficient or even unusable for their intended purposes. SiC resists erosion in exposure to an implanter ion beam, but it cannot be used alone in the beamline, by itself or as a coating on graphite, because rapid heating of the SiC causes thermal shock and cracking of the SiC, creating particles. Thus the use of the silicon carbide-graphite composite of the present disclosure achieves a utility that is not realizable by either graphite or SiC alone.

The silicon carbide-graphite composite of the present disclosure is surprisingly and unexpectedly resistant to erosion and formation of particles when exposed to an ion beam in a beamline of an ion implanter. While it is not desired to be bound by any theory or hypothesis as regards the mechanism of the composite of the present disclosure, the combination of the thermally conductive graphite and erosion-resistant SiC in the disclosed silicon carbide-graphite composite may be attributable to the SiC exhibiting low particulation and to the good thermal conductance of the graphite serving to assist in preventing the SiC matrix in the composite from cracking.

An additional surprising and unexpected advantage of the silicon carbide-graphite composite of the present disclosure is that it can be used in fabrication of ion beam components for ion implantation applications, and such components may be refurbished using grit or bead blasting to remove a top layer containing implant dopant ions such as phosphorous and arsenic, with the SiC component of the SiC matrix material in the composite serving to assist the composite to resist excessive material removal by the blasting process.

Accordingly, the silicon carbide-graphite composite of the present disclosure may be employed to form beamline components of ion implanter apparatus in which the composite reduces the number of particles that are generated from the components in the operation of the ion implanter apparatus, while providing thermal shock properties closer to graphite than to silicon carbide, yet which remains electrically conducting to enable electromagnetic steering of the ion beam. Thus, the composite enables reduction of graphite/carbon particulation in the beamline of the ion implanter apparatus. Additionally, the SiC matrix material in the composite provides a highly robust surface enabling the beamline components to be cleaned by mechanical grit blasting and re-used for a longer period of time than standard vitreous carbon infiltrated beamline components.

The silicon carbide-graphite composite of the present disclosure also enables longer lifetimes to be realized in solar implant tools when used as a hard mask material, in relation to the use of hard masks formed solely of graphite.

The silicon carbide-graphite composite of the present disclosure thus is fundamentally distinguished from silicon carbide-coated graphite structures. The composite of the present disclosure includes an unconverted graphite portion underlying the SiC matrix material in which graphite has been converted to silicon carbide containing unreacted graphite inclusions. In such composites of the present disclosure, the unconverted underlying graphite portion will typically have a thickness that is greater than the thickness of the SiC matrix layer, and in specific embodiments, the ratio of the thickness of the unconverted graphite portion (bulk graphite substrate) to the thickness of the SiC matrix portion may be in a ratio of from 5 to 10,000, or more, and in other embodiments may be in a ratio of from 10 to 1000, 15 to 500, 20 to 300, or other suitable thickness ratio value.

In terms of absolute thickness values, the silicon carbide-graphite composite of the present disclosure may in specific embodiments comprise a SiC matrix material at a thickness of 150 to 1000 μm. The silicon carbide matrix material is differentiated from silicon carbide-coated graphite, in that the SiC matrix material of the silicon carbide-graphite composite of the present disclosure is a compositional matrix of silicon carbide and graphite (carbon) with no distinct transitional demarcation of the type that would be indicative of a coated material. Accordingly, the silicon carbide-graphite composite will not delaminate under thermal or mechanical stress.

Further, the SiC matrix material provides a barrier material overlying the bulk graphite interior material, reducing the permeability of the product article. Such reduced permeability will reduce the reaction rate of oxygen or other reactive gas with the composite product article, thereby enabling it to possess an increased service life in an oxidative or chemically erosive environment. In addition, the composite product article of the present disclosure will have a greater resistance to physical erosion than a corresponding graphite (only) article.

The grain size of the graphite in the silicon carbide-graphite composite may be in a range of from 5 to 20 μm, 10 to 15 μm, or other suitable range of grain size values. The density of the silicon carbide-graphite composite of the present disclosure may be in a range of from 1.70 to 1.9 g per cc of the composite, in specific embodiments, and in other embodiments, the density may be in a range of from 1.5 to 2.1 g per cc of the composite, or a range of from 1.6 to 2.4 g per cc of the composite, or a range of from 1.8 to 2.3 g per cc of the composite, or a range of from 2.0 to 2.25 g per cc of the composite, or in other range or ranges in particular implementations of the present disclosure.

The silicon carbide-graphite composite of the present disclosure, as discussed above, differs fundamentally from silicon carbide-coated graphite structures. In silicon carbide-coated graphite structures, the graphite portion (bulk graphite substrate) is coated with SiC and the SiC coating fills pores at the top surface of the graphite portion, but there is no SiC matrix composition and morphology as in the composite of the present disclosure, in which the interior bulk graphite material and exterior silicon carbide matrix material inter-penetrate one another at an interfacial region therebetween, and in which graphite is present in inclusions in the exterior silicon carbide matrix material.

In the broad practice of the present disclosure, any suitable process conditions may be employed to effect appropriate reaction of the SiO vapor and the graphite substrate. In various embodiments, the reaction may be carried out at temperatures on the order of 1400° C.–2000° C., and pressures that are close to ambient pressure conditions, such as for example pressure of 650 torr to 1.3 bar. In various implementations, the pressure in such reaction may be in a range of from 0.9 to 1.2 bar. In other implementations, the pressure may be slightly positive, in reference to ambient (atmospheric) pressure, sufficient to provide pressure overcoming the pressure drop of the deposition reactor system including associated flow circuitry. The temperature may be correspondingly varied in specific applications, and may for example be in a range of from 1400° C. to 1800° C., 1500° C. to 1750° C., or other suitable ranges or temperature values outside the aforementioned range of 1400° C.–2000° C., as may be useful in a specific manufacturing process for producing the silicon carbide/graphite composite material of the present disclosure.

The silicon monoxide vapor utilized for reaction with graphite to form the SiC/graphite composite material of the present disclosure may be generated in any suitable manner producing SiO vapor. In various embodiments, the SiO vapor is generated by heating a solid mixture of carbon and silicon dioxide to a temperature that generates the desired SiO vapor. The carbon may be in a particulate, granular, or other finely divided form, or in other suitable morphological state, and the silicon dioxide likewise may be in a particulate, granular, or other finely divided form. In various embodiments, the silicon dioxide may be in the form of fumed silica, sometimes referred to as pyrogenic silica, to generate the SiO vapor that is flowed to the reaction chamber for reaction with the graphite material therein to produce the SiC/graphite composite of the present disclosure.

The reaction of the silicon monoxide and graphite to produce the composite material of the present disclosure may be carried out with introduction of the SiO vapor to the reaction chamber with other gaseous components. In some embodiments, it may be desirable to flow SiO vapor in neat form to the reaction chamber, and in other embodiments, it may be advantageous to introduce the silicon monoxide vapor with a sweep gas, e.g., carbon monoxide and/or inert gas such as helium, neon, argon, krypton, nitrogen, and the like. Co-flow arrangements may be utilized, in which various co-flow gas species are flowed to the reaction chamber contemporaneously with the flow of SiO vapor to the chamber, either separately from, or in mixture with, the SiO vapor.

The co-flow of carbon monoxide with the SiO vapor to the reaction chamber provides benefit in avoiding the evolution of free silicon in the reaction chamber, and serves to insure that the concentration of silicon monoxide in the reaction chamber is maintained at suitably high concentration (partial pressure) to effect formation of the silicon carbide/graphite interpenetrative composition at the interface between the interior bulk graphite of the substrate and the exterior silicon carbide matrix with graphite inclusions in the exterior matrix material. Since carbon monoxide is generated in the reaction, introduction of carbon monoxide as a co-flow gas fed to the reaction chamber may be useful to control the kinetics and equilibrium conditions of the SiO/graphite reaction.

It will be recognized that the specific temperature, pressure, flow rate, and concentration conditions for the reaction of silicon monoxide and graphite may be substantially varied within the broad practice of the present disclosure, to provide a SiC/graphite composite including interpenetration of bulk graphite and the silicon carbide matrix at the interface of the product material, with graphite inclusions in the exterior matrix.

The flow of inert gas to the reaction chamber as a sweep gas with the SiO vapor may be beneficial in effecting removal from the reaction chamber of reaction product gases, so that the reaction rate is maintained sufficiently high for commercial manufacturing operation.

It may be beneficial in specific applications to co-flow carbon monoxide, inert gas, and SiO to the reaction chamber in mixture with one another, or alternatively to flow such carbon monoxide, inert gas, and silicon monoxide to the reaction chamber in separate streams through individual respective flow lines, or alternatively to utilize a mixture of SiO vapor with one of inert gas and carbon monoxide, as a mixture thereof, and to separately introduce the other one of inert gas and carbon monoxide to the reaction chamber. It will be recognized that the specific flow schemes may be varied within the broad practice of the present disclosure, as appropriate to achieve the SiC/graphite composite of the disclosure with properties adapted to the specific end use of the material.

Thus, the reaction conditions based on the disclosure herein may be varied within the skill of the art, to provide a SiC/graphite composite of desired character. In this respect, it may be useful to empirically determine a most appropriate "process envelope", of appropriate temperature, pressure, flow rate, concentration and other conditions, by characterization of the specific SiC/graphite composite.

In this respect, it may be useful to employ process conditions that provide SiC/graphite composite characteristics such as a coefficient of thermal expansion (CTE) for the composite that provides a robust material for applications in which thermal shock incident to temperature differentials, rapid excursions of temperature conditions, thermal cycling, or other conditions that implicate the need for good CTE characteristics. For example, SiC/graphite composite materials of the present disclosure in various embodiments may have CTE values in a range of from 4 to $6.5 \times 10^{-6}$/° C.

SiC/graphite composite materials of the present disclosure having the aforementioned CTE characteristics may be advantageously utilized in applications such as ion implantation apparatus and beam line structures and components. In current systems, wherein graphite beamline structures and components are used, the beam impingement of the ionized plasma particles on beamline surfaces creates significant thermal inhomogeneities, and the temperature differentials may be such as to induce cracking, spalling, and other deleterious behavior in the graphite-based structural elements of the apparatus. As a result of the superior CTE characteristics of SiC/graphite composite materials of the present disclosure, such materials resist the adverse effects of thermal shock experienced by conventional SiC coated graphite materials, and correspondingly achieve long service life with substantially reduced mean time between failure (MTBF) in relation to such conventional materials.

Other applications involving significant temperature variations and thermal shock conditions include a high-purity semiconductor manufacturing operations, in which graphite-based susceptors are employed as substrates for fabrication of semiconductor products, such as III-V compound products, including light emitting diodes (LEDs), as well has integrated circuitry, and other microelectronics and optoelectronics products. The SiC/graphite composites of the present disclosure may also find utility in applications such as mask applications in manufacturing of photovoltaic panels, flat-panel displays, etc.

As indicated, SiC/graphite composite materials of the present disclosure may also be characterized utilizing other physical, chemical, and/or performance properties. As an illustrative example, the SiC/graphite composite may be characterized by the percent (%) weight gain, $W_g$, of the graphite material that is subjected to contact with silicon monoxide to effect reaction producing the SiC/graphite composite material, together with the surface-to-volume ratio of the product composite, S/V, wherein S is the surface area of the composite, in square centimeters, and V is the volume of the composite, in cubic centimeters. Accordingly, a characterization parameter, $C_p$, can be defined, as follows:

$$C_p = W_g/[S/V]$$

which yields $C_p$ values having units of %/cm$^{-1}$.

In general, $C_p$ values of SiC/graphite composites of the present disclosure having the previously discussed favorable CTE characteristics, possess $C_p$ values in a range of from 0.5 to 3.2%/cm$^{-1}$, more preferably in a range of from 0.5 to 2%/cm$^{-1}$, and most preferably in a range of from 0.55 to 1.8%/cm$^{-1}$.

The SiC/graphite composites of the present disclosure have additional characteristics rendering them superior to coated graphite articles of the prior art, wherein silicon carbide coatings were deposited as a capping layer on a graphite substrate article. In such instances, the coating as a result of the CTE differences between the silicon carbide coating and the interior bulk volume of the graphite will be highly susceptible to flaking, spalling, and delamination of the silicon carbide coating, resulting in contamination of the use environment in which the silicon carbide-coated graphite article is utilized, and leading to progressive weakening and ultimately failure of the coated graphite article.

The SiC/graphite composites of the present disclosure, by contrast, as a result of their exterior silicon carbide matrix interpenetrating with the interior bulk graphite at the interface, with graphite inclusions in the exterior matrix, avoid the need for such capping layer, and provide a structural material that is highly resistant to such flaking, spalling, and delamination, and that therefore provides a highly useful material in applications in which the silicon carbide-coated graphite articles of the prior art are deficient or even useless as a result of such flaking, spalling, and delamination. The SiC/graphite composites of the present disclosure therefore are advantageously formed without a capping layer thereon.

In another aspect, the SiC/graphite composite of the present disclosure may be formed with a porous graphite material so as to achieve in situ conversion bonding of graphite dust particles in the porosity of the porous graphite material. The graphite material utilized in forming the SiC/graphite composite of the present disclosure may be machined or otherwise subjected to forming operations to impart a desired shape, size, and confirmation of characteristics to the graphite, subsequent to which the graphite is reacted with SiO vapor to form the SiC/graphite composite.

Such machining and forming operations invariably produce extremely fine particles of graphite, as a graphite dust that is on surfaces and in porosity of the formed graphite article. Although the formed graphite article may be subjected to washing, vacuum extraction, and vibrational modes of processing to remove the graphite dust particles from the formed graphite article, such removal operations do not effect complete removal of the graphite dust from the formed graphite article, and invariably significant graphite dust particles are present in the porosity of the article.

The process of the present disclosure utilized to react SiO vapor with the graphite article, utilizing process conditions variously discussed herein, results in conversion of the graphite grains by the SiO present in the interstices between such dust grains of graphite, so that the graphite grains are converted to silicon carbide and the resultant silicon carbide grows across the interstitial gap between the graphite grains to effect a highly efficient interpenetration of the SiC with the bulk volume graphite material.

This approach is superior in beneficially removing and incorporating the graphite dust grains in the porosity to alternative approaches such as impregnating the porosity with organic resin source material for forming vitreous carbon in the porosity, by subjecting the formed graphite article to resin impregnation followed by pyrolysis at conditions forming vitreous carbon (sometimes referred to as glassy carbon). Such formation of vitreous carbon does effect assimilation of the graphite dust particles in the porosity of the machined or otherwise formed graphite article, but the resulting performance characteristics of the resulting product article are inferior to those achieved by conversion bonding of the graphite particles by contacting with SiO vapor, as described above. Accordingly, the SiC/graphite composite of the present disclosure is advantageously formed as a vitreous carbon-free material.

The silicon carbide/graphite composite material of the present disclosure is advantageously formed as a composite material containing no free silicon, as determined by x-ray diffraction assay of the product silicate carbide/graphite composite material. For such purpose, the reaction of SiO vapor with the graphite substrate material may be conducted in the presence of carbon monoxide or other gas mixture component(s) or composition serving to suppress the formation of elemental silicon as a reaction byproduct.

As indicated above, the SiO vapor that is used as a reactant with the graphite to form the SiC/graphite composite material of the present disclosure may be co-flowed to the reaction chamber with an inert gas. In this respect, the use of nitrogen as an inert gas for such purpose has additional benefit to the "sweep" or reactor-clearance functions described earlier herein, in that nitrogen from such co-flow will be incorporated in the SiC/graphite composite material at dopant concentration levels, and such dopant nitrogen content may be beneficially employed to improve performance characteristics of the composite material, including electrical properties such as resistivity, tribological properties including hardness and impact resistance, and thermal properties. For such purpose, the nitrogen inert gas may be employed in mixture with the SiO vapor at concentration levels ranging from 5% to 50% by volume, based on total volume of the gas mixture including the SiO and the nitrogen gas. The doping concentration level of nitrogen in the SiC/graphite composite material may correspondingly be at any desired level, by selection of appropriate concentration and partial pressure of the nitrogen component of the SiO/N$_2$ gas mixture, and in various embodiments, the nitrogen content may be on the order of from about 0.1 to 1.2% by weight, based on total weight of the SiC/graphite material. In other embodiments, the nitrogen content may be on the order of from 0.2% to 0.9% by weight, and in still other embodiments, the nitrogen content may be on the order of from 0.3% to 0.7%, on the same SiC/graphite total weight basis. In a specific embodiment, the nitrogen content of the SiC produced by the method of the present disclosure was measured as 2.34×10$^{20}$ atoms/cc of SiC/graphite composite material.

It will be appreciated from the foregoing that the reaction of SiO vapor with graphite to form the SiC/graphite composite material of the present disclosure may be conducted under varying conditions, involving various combinations of the process conditions variously described herein, with material characterization and assessment being employed to identify specific operating conditions for production of the SiC/graphite material of the disclosure.

Thus, the disclosure contemplates a method of making a silicon carbide-graphite composite, comprising contacting a graphite article with silicon monoxide (SiO) gas under chemical reaction conditions that are effective to convert an exterior portion of the graphite article to a silicon carbide matrix material in which graphite is present in inclusions therein, and wherein the silicon carbide matrix material and interior bulk graphite material interpenetrate one another at an interfacial region therebetween.

In such method, the graphite article may be provided for the contacting with a predetermined shape or form. Such predetermined shape or form may be provided by machining a starting graphite article to impart the predetermined shape or form thereto, e.g., by lasing of the starting graphite article to photonically remove the material.

As discussed, the contacting chemical reaction conditions may comprise temperature in any suitable range, such as for example: temperature in a range of from 1400 to 2000° C.; temperature in a range of from 1600 to 1900° C.; temperature in a range of from 1750 to 1850° C.; temperature in a range of from 1400 to 1800° C.; temperature in a range of from 1500 to 1750° C.; or temperature in another range.

In the method broadly described above, the contacting may be carried out with the silicon monoxide in a gas mixture at a concentration of from 5 to 50% by volume, based on the total volume of the gas mixture. In various embodiments, the gas mixture may comprise CO, and/or inert gas, e.g., nitrogen.

The contacting chemical reaction conditions may comprise any suitable pressure, such as pressure in a range of from 650 torr to 1.3 bar, or pressure in a range of from 0.9 to 1.2 bar, or pressure that is sufficiently positive, in reference to ambient pressure, to overcome pressure drop of a deposition reactor system and associated flow circuitry utilized to carry out the chemical reaction, or other pressure conditions.

In the method broadly described above, the SiO gas may be generated by heating a solid mixture of carbon and silicon dioxide, as for example wherein the carbon is in a particulate, granular, or other finely divided form, and/or wherein the silicon dioxide is in a particulate, granular, or other finely divided form. The silicon dioxide in a specific embodiment may comprise fumed silica.

In the broadly described method of the disclosure, the chemical reaction may be carried out in a reaction chamber to which SiO vapor is flowed. In various embodiments, a sweep gas may also be flowed to the reaction chamber. In other of various embodiments, carbon monoxide and/or inert gas (e.g., helium, argon, neon, krypton, nitrogen, etc.) may also be flowed to the reaction chamber.

The disclosure further contemplates a method of making a silicon carbide-graphite composite, comprising contacting a graphite article with silicon monoxide (SiO) gas under chemical reaction conditions that are effective to convert an exterior portion of the graphite article to a silicon carbide matrix material in which graphite is present in inclusions therein, and wherein the silicon carbide matrix material and interior bulk graphite material interpenetrate one another at an interfacial region therebetween, wherein the chemical reaction conditions are effective to yield the silicon carbide-graphite composite, wherein the composite is characterized by any two or more characteristics selected from the group consisting of:

(i) the ratio of the thickness of the interior bulk graphite material to the thickness of the exterior silicon carbide matrix material is in a range of from 5 to 10,000;
(ii) the exterior silicon carbide matrix material has a thickness in a range of from 150 to 1000 µm;
(iii) the grain size of graphite in the silicon carbide-graphite composite is in a range of from 5 to 20 µm;
(iv) the density of the silicon carbide-graphite composite is in a range of from 1.6 to 2.4 g per cc of the composite;
(v) the coefficient of thermal expansion (CTE) of the composite is in a range of from 4 to $6.5 \times 10^{-6}$/° C.;
(vi) a characterization parameter, $C_p$, of the composite being in a range of from 0.5 to 3.2%/cm$^{-1}$, wherein $C_p$ is defined by the relationship $C_p = W_g/[S/V]$, wherein $W_g$ is the percent (%) weight gain of the graphite material that is subjected to contact with silicon monoxide to effect reaction producing the composite; and S/V is the surface-to-volume ratio of the product composite, wherein S is the surface area of the composite, in square centimeters, and V is the volume of the composite, in cubic centimeters;
(vii) the composite is devoid of any silicon carbide capping layer thereon;
(viii) the composite is a vitreous carbon-free composite;
(ix) formation of the composite has comprised conversion bonding of graphite dust grains in porosity of the interior bulk graphite material;
(x) the composite contains no free silicon; and
(xi) the composite is doped with nitrogen.

In the method comprising such combinations and permutations of two or more of characteristics (i)-(xi), the graphite article may be configured for use as a structural article of an ion implantation system, wherein the silicon carbide matrix material of the composite provides at least a portion of the surface of the structural article. The structural article of the ion implantation system may be configured to be comprised in one of beam line assemblies, beam steering lenses, ionization chamber liners, beam stops, and ion source chambers of the ion implantation system. Alternatively, the graphite article may be configured for use as a susceptor for an LED growth apparatus, wherein the silicon carbide matrix material of the composite provides at least a portion of surface of the susceptor.

Figure 1:
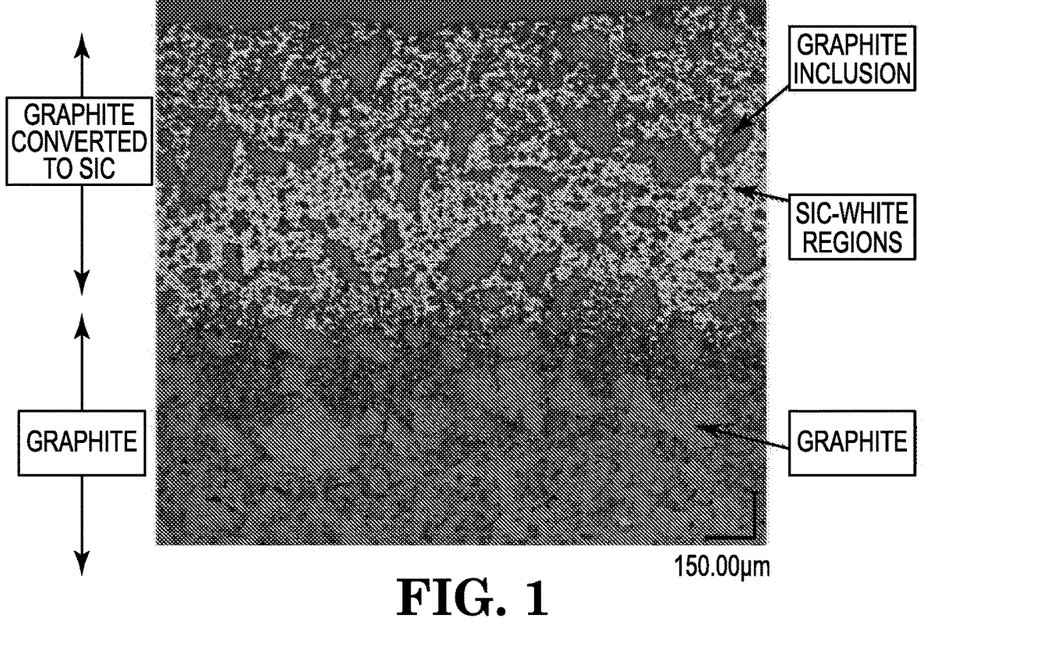
FIG. 1 is an electron micrograph (metallograph) at magnification of 200 times, showing the microstructure of the SiC matrix material and interfacial region of a silicon carbide-graphite composite of the present disclosure. The micrograph is labeled to indicate the approximate thickness of the SiC matrix material comprising reaction-converted graphite and the underlying bulk graphite material. As illustrated, the SiC matrix material contains graphite inclusions and at the interface there is interpenetration of the respective interior bulk graphite material and exterior silicon carbide matrix material.

Referring now to the drawings, FIG. 1 is an electron micrograph (metallograph) at magnification of 200 times, showing the microstructure of the SiC matrix material and interfacial region of a silicon carbide-graphite composite of the present disclosure. The micrograph is labeled to indicate the approximate thickness of the SiC matrix material comprising reaction-converted graphite and the underlying bulk graphite material. As illustrated, the SiC matrix material contains graphite inclusions and at the interface there is interpenetration of the respective interior bulk graphite material and exterior silicon carbide matrix material.

Figure 2:
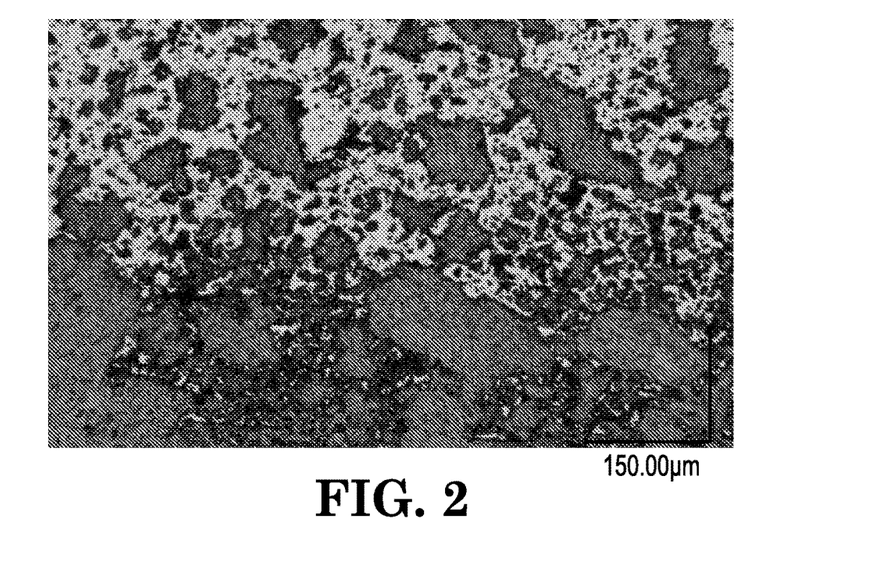
FIG. 2 is an electron micrograph (metallograph) at magnification of 200 times, showing the microstructure in the interfacial region of the composite of FIG. 1, as involving interpenetration of the interior bulk graphite material and exterior silicon carbide matrix material.

FIG. 2 is an electron micrograph (metallograph) at magnification of 200 times, showing the microstructure in the interfacial region of the composite of FIG. 1, as involving interpenetration of the interior bulk graphite material and exterior silicon carbide matrix material.

Figure 3:
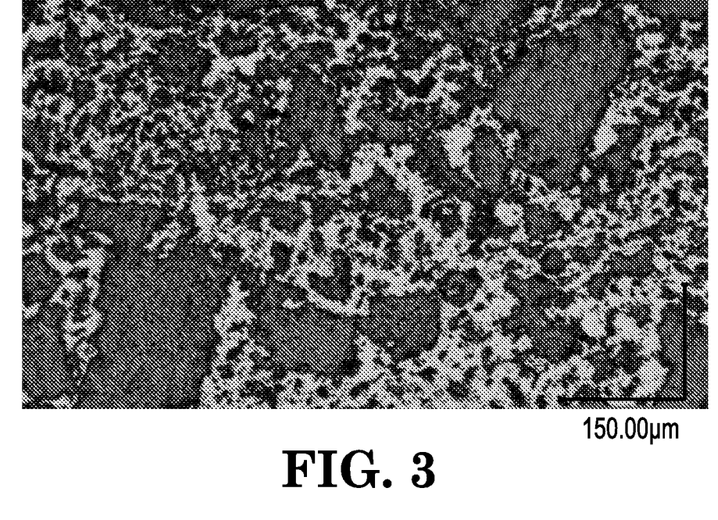
FIG. 3 is an electron micrograph (metallograph) at magnification of 200 times, showing the upper surface region of the SiC matrix material of the FIG. 1 composite, showing the graphite inclusions in such matrix material.

FIG. 3 is an electron micrograph (metallograph) at magnification of 200 times, showing the upper surface region of the SiC matrix material of the FIG. 1 composite, showing the graphite inclusions in such matrix material.

Figure 4:
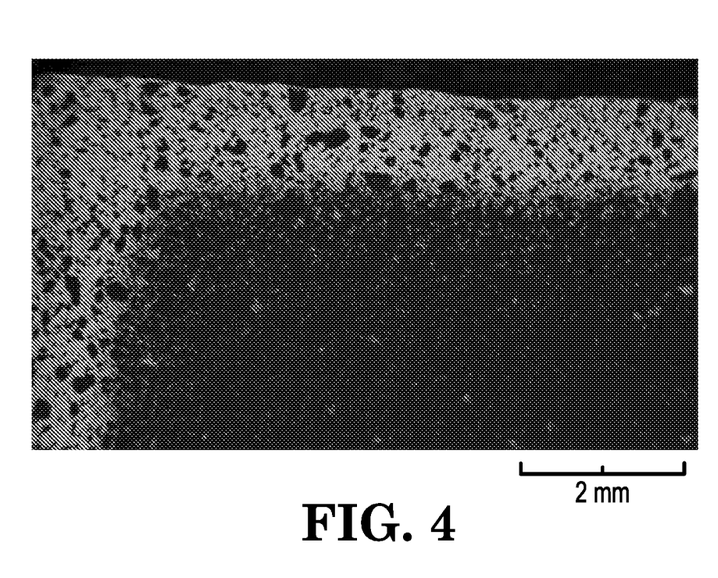
FIG. 4 is a scanning electron microscope (SEM) backscatter image of the composite of FIG. 1, at magnification of 100 times, wherein light areas of the image show SiC and dark areas of the image show C (graphite), clearly evidencing the graphite inclusions in the SiC matrix material.

FIG. 4 is a scanning electron microscope (SEM) backscatter image of the composite of FIG. 1, at magnification of 100 times, wherein light areas of the image show SiC and dark areas of the image show C (graphite), clearly evidencing the graphite inclusions in the SiC matrix material.

Figure 5:
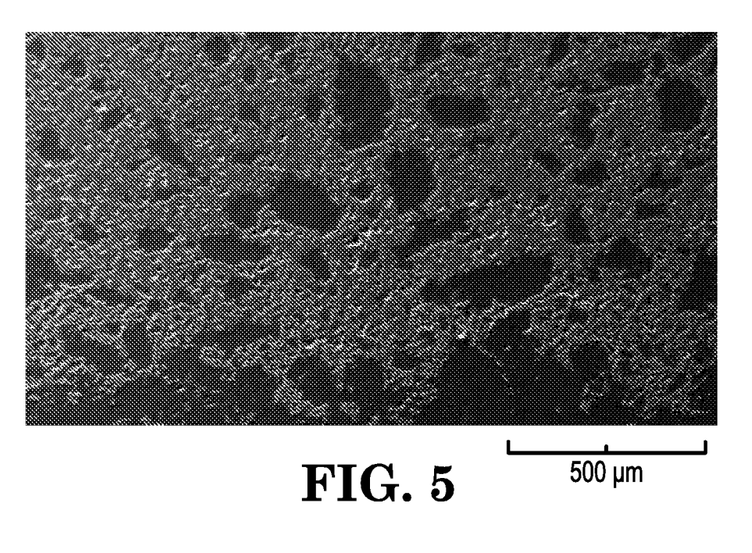
FIG. 5 is an electron photomicrograph, at 500 times magnification, of the interfacial region of the composite of FIG. 1, showing the interpenetration of the SiC matrix material and the bulk graphite material.

FIG. 5 is an electron photomicrograph, at 500 times magnification, of the interfacial region of the composite of FIG. 1, showing the interpenetration of the SiC matrix material and the bulk graphite material.

Figure 6:
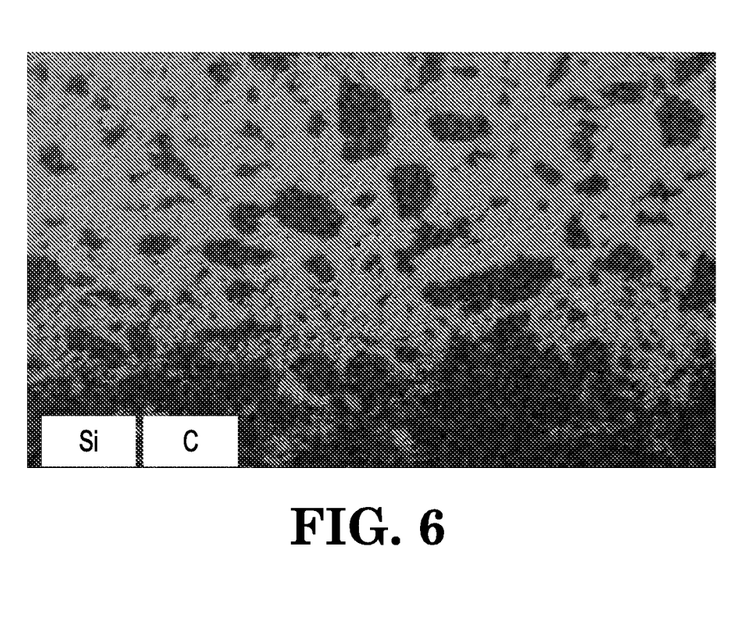
FIG. 6 is a corresponding elemental map, at 500 times magnification, of the photomicrograph of FIG. 5, wherein the SiC matrix material is shown as the lighter colored material, containing graphite inclusions as the darker colored material.

FIG. 6 is a corresponding elemental map, at 500 times magnification, of the photomicrograph of FIG. 5, wherein the SiC matrix material is shown as the lighter colored material, containing graphite inclusions as the darker colored material.

Figure 7:
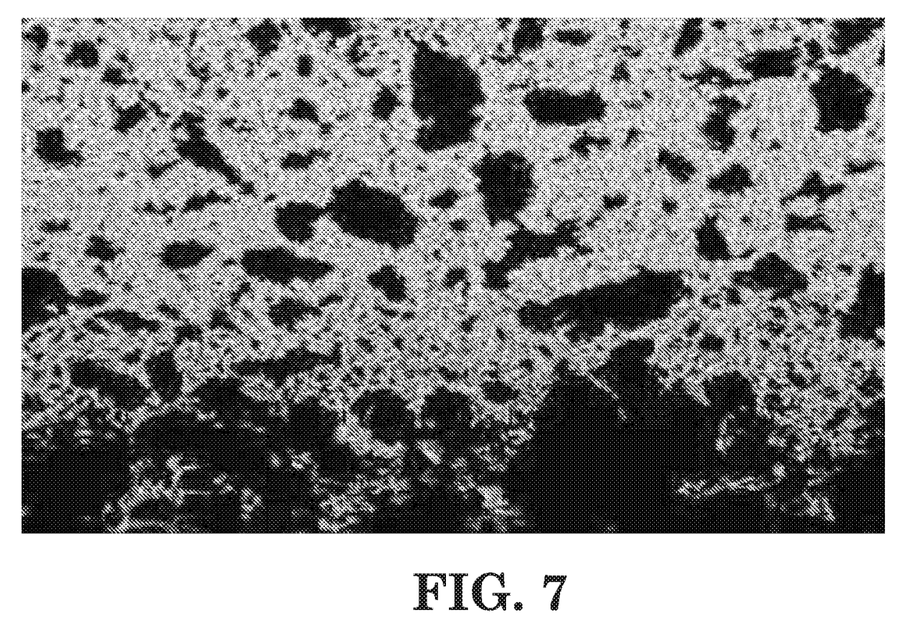
FIG. 7 is a corresponding elemental map, at 500 times magnification, of the photomicrograph of FIG. 5, showing the silicon in the composite.

FIG. 7 is a corresponding elemental map, at 500 times magnification, of the photomicrograph of FIG. 5, showing the silicon in the composite.

Figure 8:
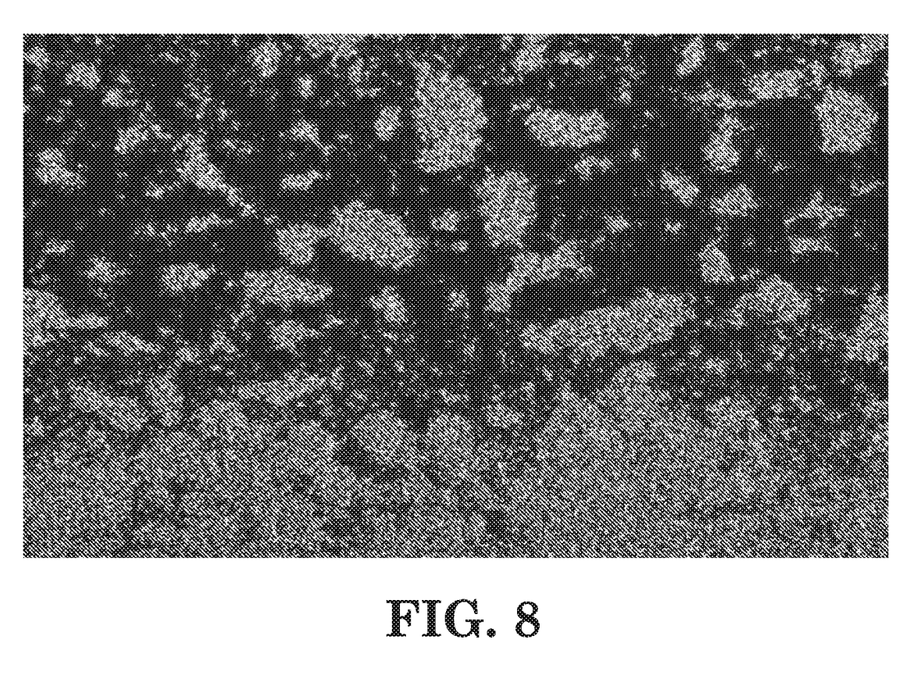
FIG. 8 is a corresponding elemental map, at 500 times magnification, of the photomicrograph of FIG. 5, showing the carbon (graphite) in the composite.

FIG. 8 is a corresponding elemental map, at 500 times magnification, of the photomicrograph of FIG. 5, showing the carbon (graphite) in the composite.

Figure 9:
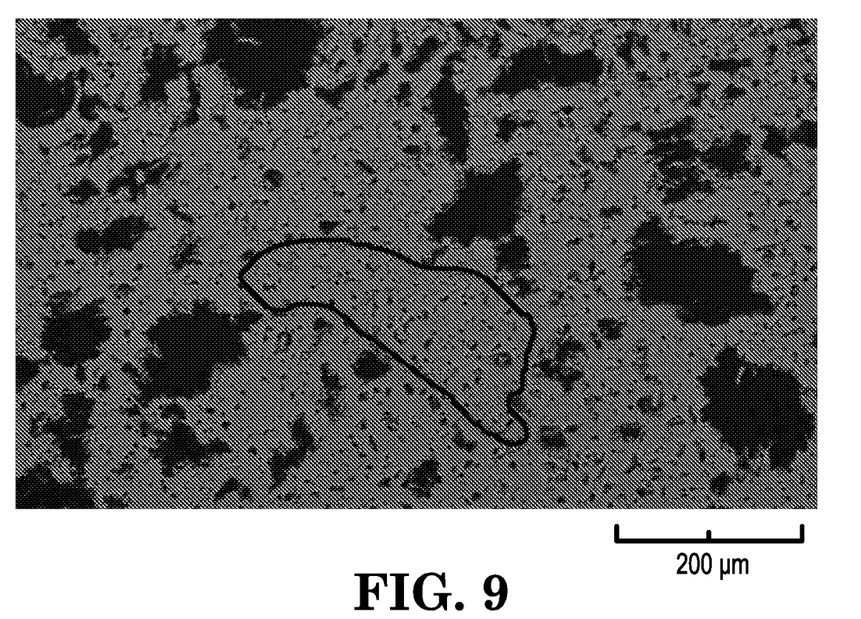
FIG. 9 is a backscatter image, at 1000 times magnification, of a region of the SiC matrix material, as demarcated by the outlined shape in the central portion of the image, as submitted to EDX analysis, showing the material within such outline as comprising 38.83 wt. % carbon, 5.60 wt. % oxygen, and 55.57 wt. % silicon, thereby reflecting the interpenetration of the bulk graphite phase and the silicon carbide matrix phase in the SiC matrix material of the composite.

FIG. 9 is a backscatter image, at 1000 times magnification, of a region of the SiC matrix material, as demarcated by the outlined shape in the central portion of the image, as submitted to EDX analysis, showing the material within such outline as comprising 38.83 wt. % carbon, 5.60 wt. % oxygen, and 55.57 wt. % silicon, thereby reflecting the interpenetration of the bulk graphite phase and the silicon carbide matrix phase in the SiC matrix material of the composite.

As discussed hereinearlier, the silicon carbide-graphite composite of the present disclosure in the can be used in fabrication of ion beam components for ion implantation applications, and such components may be refurbished by grit or bead blasting without excess removal of material by the blasting process.

Figure 10:
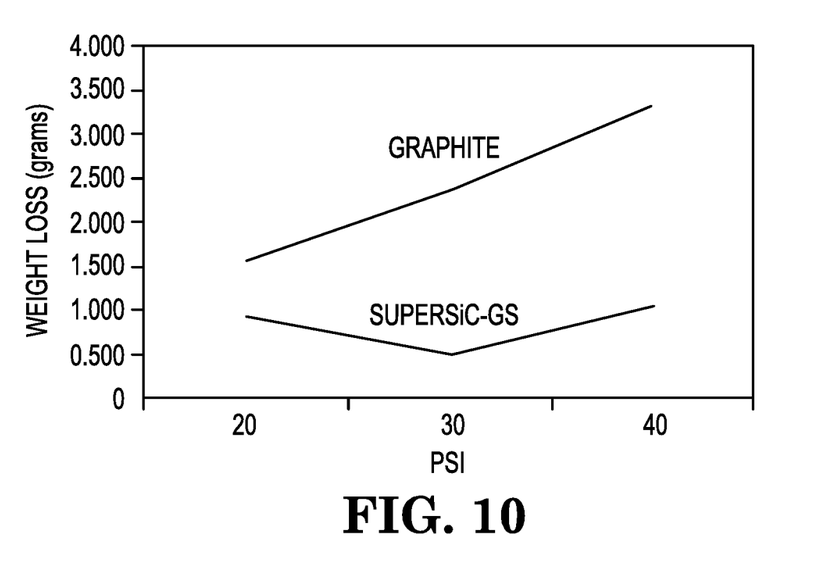
FIG. 10 is a graph of erosion resistance, of a base graphite material ("Graphite"), and a silicon carbide-graphite composite of the present disclosure in which the core is formed of the base graphite material ("SUPERSiC-GS"), in which weight loss, in grams, is plotted as a function of SiC grit blasting air pressure, in psi.

The superior erosion resistance of the silicon carbide-graphite composite of the present disclosure is shown by the data in the graph of FIG. 10, in which weight loss, in grams, is plotted as a function of grit blasting air pressure, in psi, for a base graphite material ("Graphite") and for a silicon carbide-graphite composite of the present disclosure in which the core is formed of the base graphite material ("SUPERSiC-GS"). To generate the data shown in FIG. 10, the respective materials were SiC grit blasted at 20, 30, and 40 psi air pressure to test their abrasion resistance. As shown by the data in the graph, the silicon carbide-graphite composite of the present disclosure exhibited markedly reduced weight loss in relation to the base graphite material.

Silicon carbide-graphite composite articles of the present disclosure will be substantially less expensive than a full SiC article, since all machining and product article formation operations may be conducted on the graphite starting article, without substantial change in physical dimensions of the product article resulting from the formation of the SiC matrix material on the graphite starting article. The SiC matrix material at the surface of the silicon carbide-graphite composite article is highly electrically conductive, with an electrical resistivity that characteristically is less than about 1 ohm-cm.

The silicon carbide-graphite composite material of the present disclosure also has a very high purity, making it an attractive material for use in semiconductor or high brightness LED applications. Set out in Table 2 below is a listing of elemental analysis data for an illustrative silicon carbide-graphite composite material of the present disclosure, as determined by laser ablation inductively coupled plasma mass spectrometry (LA-ICP-MS) elemental analysis determination.

TABLE 2

| Element | |
|---|---|
| B | 0.04 ppm |
| Na | 0.10 ppm |
| Mg | 0.10 ppm |
| Al | 0.20 ppm |
| P | 0.35 ppm |
| S | 1.05 ppm |
| K | 0.30 ppm |
| Ca | 0.30 ppm |
| Ti | 0.08 ppm |
| V | 0.17 ppm |
| Cr | 0.20 ppm |
| Mn | 0.12 ppm |
| Fe | 0.30 ppm |
| Co | 0.00 ppm |
| Ni | 0.30 ppm |
| Cu | 0.01 ppm |
| Zn | 0.01 ppm |
| Zr | 0.30 ppm |
| Mo | 0.06 ppm |

Given its low cost, high purity, low electrical resistivity, and high mechanical integrity, the silicon carbide-graphite composite material of the disclosure represents a superior material for use as an ion implanter beamline component, such as a lens, beam stop, or other chamber component. These features, particularly the resistance to sputtering and ablation, render the silicon carbide-graphite composite material of the present disclosure highly desirable in solar implant hard mask applications.

While the disclosure has been set forth herein in reference to specific aspects, features and illustrative embodiments, it will be appreciated that the utility of the disclosure is not thus limited, but rather extends to and encompasses numerous other variations, modifications and alternative embodiments, as will suggest themselves to those of ordinary skill in the field of the present disclosure, based on the description herein. Correspondingly, the disclosure as hereinafter claimed is intended to be broadly construed and interpreted, as including all such variations, modifications and alternative embodiments, within its spirit and scope.

What is claimed is:

1. A silicon carbide-graphite composite comprising;
   (i) a first interior region including a bulk graphite material;
   (ii) a second exterior region including a silicon carbide matrix material defining an exterior of the composite, wherein graphite is present inclusions in the silicon carbide matrix material; and
   (iii) an interfacial region between the first region including the bulk graphite material and the second region including the silicon carbide matrix material, wherein the bulk graphite material and exterior silicon carbide matrix material inter-penetrate one another at the interfacial region,
   wherein the composite is devoid of any silicon carbide capping layer.

2. The silicon carbide-graphite composite of claim 1, wherein each of the (i) interior bulk graphite material and (ii) exterior silicon carbide matrix material has a respective thickness, wherein the thickness of the interior bulk graphite material is greater than the thickness of the exterior silicon carbide matrix material.

3. The silicon carbide-graphite composite of claim 1, wherein the exterior silicon carbide matrix material has a thickness in a range of from 150 to 1000 μm.

4. The silicon carbide-graphite composite of claim 1, wherein the grain size of graphite in the silicon carbide-graphite composite is in a range of from 5 to 20 μm.

5. The silicon carbide-graphite composite of claim 1, wherein the density of the silicon carbide-graphite composite is in a range of from 1.6 to 2.4 g per cc of the composite.

6. The silicon carbide-graphite composite of claim 1, wherein coefficient of thermal expansion (CTE) of the composite is in a range of from 4 to $6.5 \times 10^{-6}$/° C.

7. The silicon carbide-graphite composite of claim 1, wherein the composite has a characterization parameter, $C_p$, in a range of from 0.5 to 3.2%/cm$^{-1}$, wherein $C_p$ is defined by the relationship:

$$C_p = W_g/[S/V]$$

wherein:
   $W_g$, is the percent (%) weight gain of the graphite material that is subjected to contact with silicon monoxide to effect reaction producing the composite; and
   S/V is the surface-to-volume ratio of the product composite, wherein S is the surface area of the composite, in square centimeters, and V is the volume of the composite, in cubic centimeters.

8. The silicon carbide-graphite composite of claim 1, wherein the composite is a vitreous carbon-free composite.

9. The silicon carbide-graphite composite of claim 1, wherein the composite contains no free silicon.

10. The silicon carbide-graphite composite of claim 1, wherein the composite is doped with nitrogen.

11. The silicon carbide-graphite composite of claim 1, wherein the composite is doped with nitrogen at a nitrogen content of from 0.1 to 1.2% by weight, based on total weight of the composite.

12. An article comprising a silicon carbide-graphite composite, the silicon carbide-graphite composite comprising
 (i) a first interior region including a bulk graphite material;
 (ii) a second exterior region including a silicon carbide matrix material defining an exterior of the composite, wherein graphite is present inclusions in the silicon carbide matrix material; and
 (iii) an interfacial region between the first region including the bulk graphite material and the second region including the silicon carbide matrix material, wherein the bulk graphite material and exterior silicon carbide matrix material inter-penetrate one another at the interfacial region,
 wherein the composite is devoid of any silicon carbide capping layer.

13. The article of claim 12, comprising an implant hard mask.

14. The article of claim 12, comprising a susceptor for an LED growth apparatus, wherein the silicon carbide matrix material of the composite is at least a portion of a surface of the susceptor.

15. The article of claim 14, wherein the susceptor contains through hole(s) therein, and the silicon carbide matrix material of the composite is at internal surface of the hole(s).

* * * * *